(12) United States Patent
Yerdon et al.

(10) Patent No.: US 7,385,308 B2
(45) Date of Patent: Jun. 10, 2008

(54) ADVANCED AUTOMOTIVE CONTROL SWITCHES

(75) Inventors: Timothy J. Yerdon, Plymouth, MI (US); Royce D. Channey, Highland Park, MI (US); Henry L. Pope, Redford, MI (US)

(73) Assignee: Visteon Global Technologies, Inc., Dearborn, MI (US)

( * ) Notice: Subject to any disclaimer, the term of this patent is extended or adjusted under 35 U.S.C. 154(b) by 252 days.

(21) Appl. No.: 11/234,998

(22) Filed: Sep. 26, 2005

(65) Prior Publication Data

US 2007/0068790 A1    Mar. 29, 2007

(51) Int. Cl.
*B60L 1/00* (2006.01)
(52) U.S. Cl. .................................... 307/9.1
(58) Field of Classification Search ............. 307/9.1
See application file for complete search history.

(56) References Cited

U.S. PATENT DOCUMENTS

| | | | |
|---|---|---|---|
| 5,760,554 A | 6/1998 | Bustamante | 318/280 |
| 7,176,885 B2* | 2/2007 | Troxell et al. | 345/156 |
| 2004/0164971 A1* | 8/2004 | Hayward et al. | 345/179 |

\* cited by examiner

*Primary Examiner*—Robert L. Deberadinis
(74) *Attorney, Agent, or Firm*—Brinks Hofer Gilson & Lione

(57) ABSTRACT

An electronic switch for a device in an automotive vehicle comprises an input pad mounted in an interior of the automotive vehicle, the input pad comprising a sensing mechanism operable to generate a plurality of control signals associated with a plurality of sensing positions of the input pad. The electronic switch further comprises a controller in communication with the input pad and the device, the controller configured to actuate a plurality of switch control functions of the device in response to the plurality of control signals.

18 Claims, 6 Drawing Sheets

ADVANCED AUTOMOTIVE CONTROL SWITCHES

FIELD OF THE INVENTION

The present invention relates, generally, to electronic control switches, and more particularly, to automotive electronic control switches utilizing projective capacitance sensing.

BACKGROUND

Typically, automotive electronic control switches are mechanically based and provide relatively simple controls (radio buttons, heating, ventilating and air conditioning (HVAC) knobs, etc.). These simple controls are functionally limited, not necessarily intuitive, and may be costly to change. Many of these controls also lack lighting which provides intuitive feedbacks, and haptic feedbacks, such as via vibrations or mechanical clicks.

Generally, these mechanically based switches or buttons for electrically actuated devices protrude from a surface of a corresponding device, and require a user to hold them or manipulate them to a determined location until the device has reached a desired position. Alternately, switch configurations may enable the user to move a switch to a position wherein the device is automatically actuated to one extreme position or to an opposite extreme position, but do not allow the user to actuate the device to a position other than these extreme positions via a relatively simple transitory touch or contact.

Moreover, these mechanically based switches or buttons are substantially inconvenient to the user as a relatively lengthy interaction or contact period with the switches may be needed to fully and properly accomplish a predetermined positioning of the switches.

Additionally, these mechanically based switches or buttons typically include moving parts, which tend to increase potential switch failures, limit their operations on complex surfaces or their placements or incorporations behind other surfaces.

Accordingly, there is a need for addressing the problems noted above and others previously experienced.

OBJECT AND SUMMARY

The present invention is defined by the appended claims. This description summarizes some aspects of the present embodiments and should not be used to limit the claims.

An electronic switch system for a device in an automotive vehicle includes an input pad and a controller. The input pad, which is mounted in a recess of an interior of the automotive vehicle, includes a sensing mechanism adapted for generating a plurality of control signals associated with a plurality of sensing positions of the input pad. The controller, which is in communication with the input pad and the device, is configured to actuate a plurality of switch control functions of the device in response to the plurality of control signals.

In an advantageous feature, the sensing mechanism comprises a projected capacitive sensing unit, which enables functionality before the sensing input pad is touched.

In an advantageous feature, the controller is programmable such that each of the plurality of sensing positions of the input pad generates a unique resultant control signal.

In another advantageous feature, the input pad is operable either on or behind various materials, these materials being molded or wrapped skins of instrument panels, dashboards, door trims, center consoles, overhead consoles, seats, pillars, and the like.

In another advantageous feature, the input pad comprises a continuum of sensing positions.

Illustrative and exemplary embodiments of the invention are described in further detail below with reference to and in conjunction with the figures.

BRIEF DESCRIPTION OF THE DRAWINGS

The invention, including its construction and method of operation, is illustrated diagrammatically in the drawings, in which.

DETAILED DESCRIPTION OF THE DRAWINGS

Figure 1:
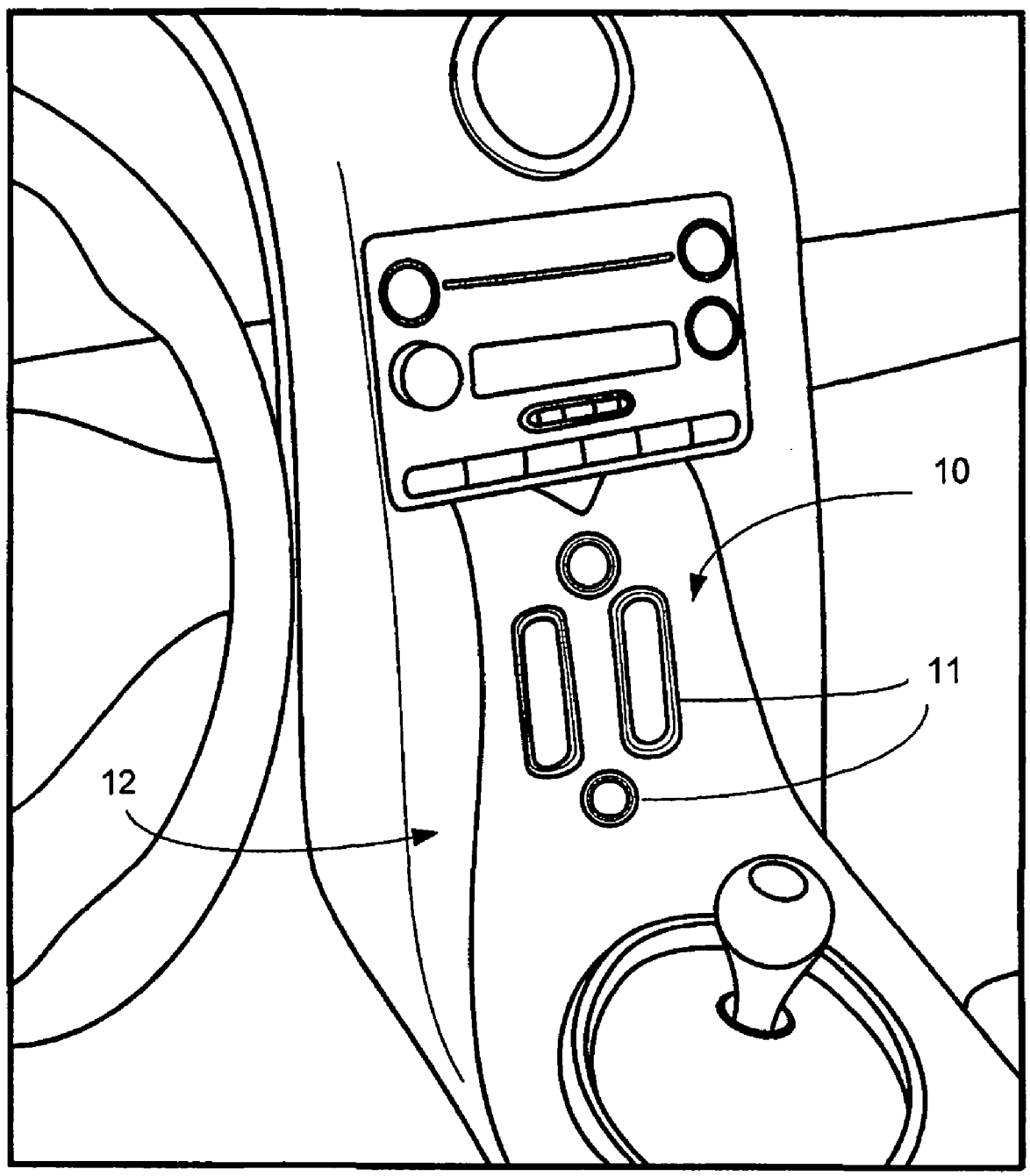
FIG. 1 is a front perspective view of a cluster of electronic switches for devices in an automotive vehicle in accordance with the present invention.

While the present invention may be embodied in various forms, there is shown in the drawings and will hereinafter be described some exemplary and non-limiting embodiments, with the understanding that the present disclosure is to be considered an exemplification of the invention and is not intended to limit the invention to the specific embodiments illustrated.

In this application, the use of the disjunctive is intended to include the conjunctive. The use of definite or indefinite articles is not intended to indicate cardinality. In particular, a reference to "the" object or "a and an" object is intended to denote also one of a possible plurality of such objects.

Turning now to the drawings, and particularly to FIG. 1, an electronic switch cluster embodying the principles of the present invention is illustrated and generally designated at 10. The electronic switch cluster 10 includes a plurality of electronic switch apparatuses 11. Each of the plurality of electronic switch apparatuses 11 is shown mounted in a corresponding recess (not shown) of a molded cover of an instrument panel 12. As shown, the instrument panel 12 is peripherally connected to at least a portion of each of electronic switch apparatuses 11.

Figure 2:
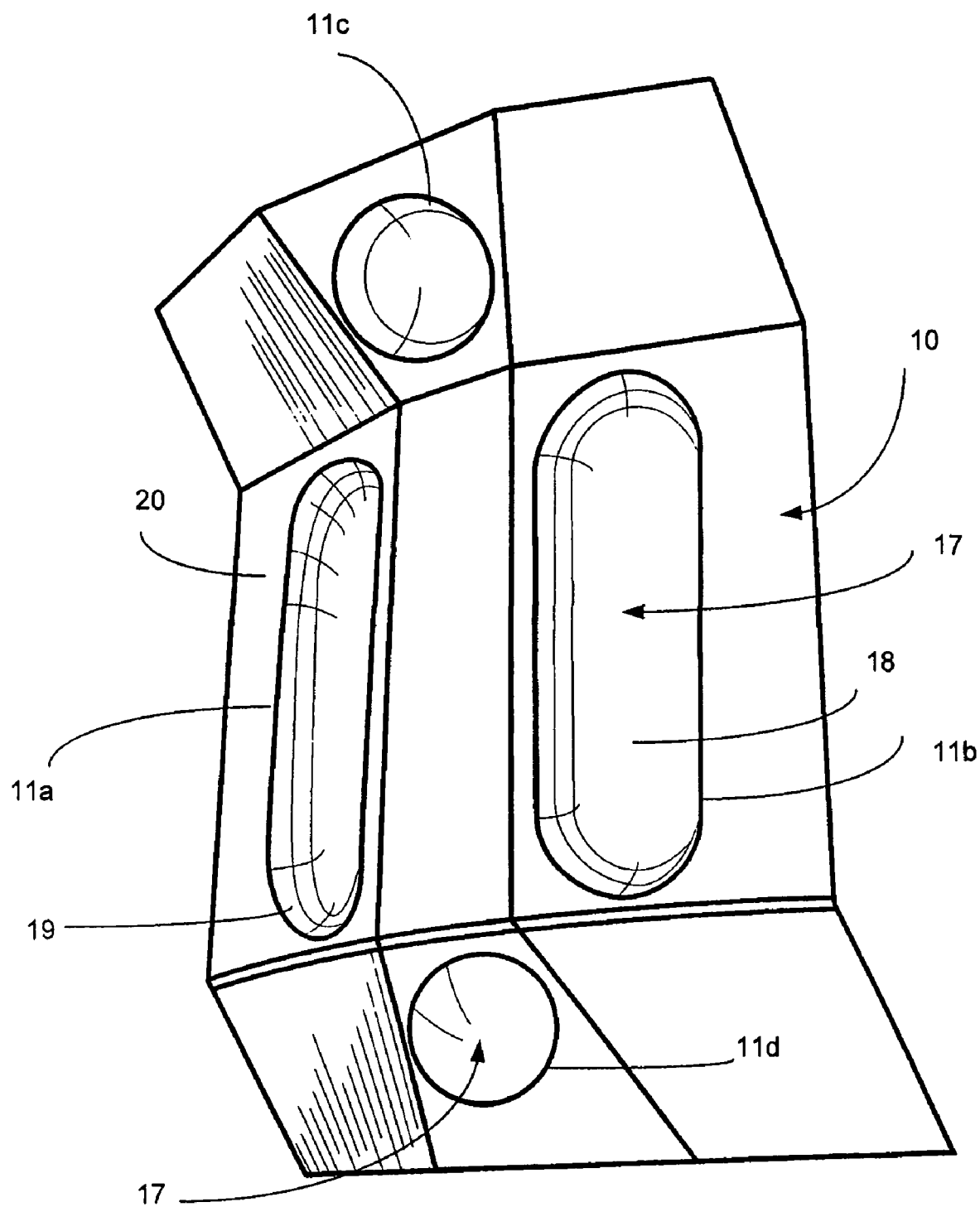
FIG. 2 is a front perspective view of the cluster of electronic switches for automotive devices of FIG. 1 shown recessed in a complex instrument panel surface.

Now referring to FIG. 2, the electronic switch cluster 10 for automotive devices of FIG. 1 is shown mounted in a complex console surface. The electronic switch cluster 10 has four electronic switches 11a-11d. Two of the four electronic switches 11a-11b are configured with relatively elongated shapes having rounded ends, and the other two switches 11c and 11d are configured with substantially circular shapes. Alternately, these four electronic switches 11a-11d may have any particular or appropriate shapes. Each of the four electronic switches 11a-11d has an input pad 17 positioned within an opening 18.

For the sake of simplicity, hereafter only one electronic switch, say 11, will be referred to when discussing or describing elements and functions common to all four electronic switches 11a-11d. The input pad 17 is a flexible non-mechanical unit incorporating projective capacitance sensing technology. The input pad 17 may have a planar or complex surface 18. This projective capacitance sensing technology allows for flexible non-mechanical switches to be mounted either on or behind various materials, such as molded or wrapped skins of instrument panels, door trims, center consoles, overhead consoles, seats, pillars, etc. . . . As such, this projective capacitance sensing technology allows for "hidden" electronic switches that do not need to protrude from covering surfaces.

This projective capacitance sensing technology is manufactured by a variety of companies, such as 3M Company (Registered Trademark). 3M Company and its corresponding products are discussed hereafter as examples only. Thus, for example, 3M offers a projective capacitance sensing product, named "3M Thrupad"™. The "3M Thrupad"™ is a Z-axis position projected capacitive sensor, which allows functionality before even touching the sensing input pad. This "3M Thrupad"™ sensor is currently used in touch screens and can conform to multiple geometries, and is only limited to mounting behind nonconductive materials. Sensitivity and activation of this "3M Thrupad"™ sensor are adjustable through software programming. In regard to sensitivity, this "3M Thrupad"™ sensor works substantially well even with gloved hands. 3M offers another projective capacitance sensing product, named "3M MicroTouch"™. In contrast to the "3M Thrupad"™ the "3M MicroTouch"™ further provides X, Y axis position sensing.

Based on changes in an electrostatic field generated by a conductive object (gloved or ungloved finger, pen, stylus, etc. . . . ) approaching the input pad 17, a sensing circuitry (not shown) of the projected capacitive sensor generates a substantially precise profile of the approaching object through highly specialized data acquisition and image processing techniques. The sensing circuitry can determine and resolve the approaching object profile to a sensing or touching position on the input pad 17 via two-dimensional X Y coordinates. These X Y coordinates of the sensing position are fed to an interface or controller such that each sensing position may be programmed to generate a unique resultant signal. The interface or controller will further be discussed in details below.

As shown in FIG. 2, the input pad 17 may be positioned so that surface 18 is located in a relatively shallow depression surrounded by relatively short sidewalls 19. Alternately, the input pad surface 18 may be substantially aligned or flush with a top surface 20 of the instrument panel 12. Alternately, the input pad surface 18 may protrude slightly above the instrument panel top surface 21. The shallow sidewalls 19 may also be surrounded by a flange (not shown) that may extend outwardly therefrom onto a surrounding portion of the instrument panel top surface 20.

Potential applications of the plurality of switch apparatuses 11 may include all existing and future human machine interface (HMI) controls, for example, radio controls, CD and DVD controls, climate controls, mirror controls, steering wheel controls, seat adjustment controls, ventilation controls, navigation controls, voice activated system controls, cruise controls, rear seat entertainment controls, rear seat climate controls, engine start, trunk and/or hood release, fuel door release, mileage/odometer controls, traction controls (All Wheel/Four Wheel Drive), assisted front steering, airbag on/off, vehicle presets (i.e. seating position, radio presets, etc.), privacy screens, glove box release, instrument panel bin release, door controls, window controls, defroster controls, headlight controls, windshield wiper controls, turn signals, console release, overhead lighting controls, emergency flashers, sun/moon roof controls, interior lighting controls, gear select (shifter), rear view mirror controls (i.e. night/day mode controls), vehicle horn, etc. . . . Thus, this projective capacitive sensing technology may be integrated and used on various automotive electronic products. All of these various potential applications may aid in simplifying HMI while reducing a complexity in design and manufacturing of the corresponding switch apparatuses.

While the electronic switch cluster 10 is shown as being mounted in recesses of the instrument panel 12, it will be understood and appreciated that the electronic switch apparatus 11a is equally adaptable for mounting, in recesses or otherwise, in any other cover or substrate of an interior part of the automotive vehicle. Such mounting location of the electronic switch apparatus 11 may serve to minimize an adjustment time of the operator's eyes, while driving, between the road ahead and the electronic switch apparatus 11 when shifting attention from the road ahead to the electronic switch apparatus 11, and vice-versa. Alternately, such location of the electronic switch apparatus 11 may serve to improve ergonomically an environment of the operator and/or passenger within the automotive vehicle.

Alternately, the electronic switch cluster 10 may be integrated onto a substrate or into a vessel, such as a mold, and mechanically attached to the interior of the vehicle, such as a dashboard, an overhead location of the vehicle, or an arm or head rest, via Velcro, tape or any appropriate adhesives.

Figure 3:
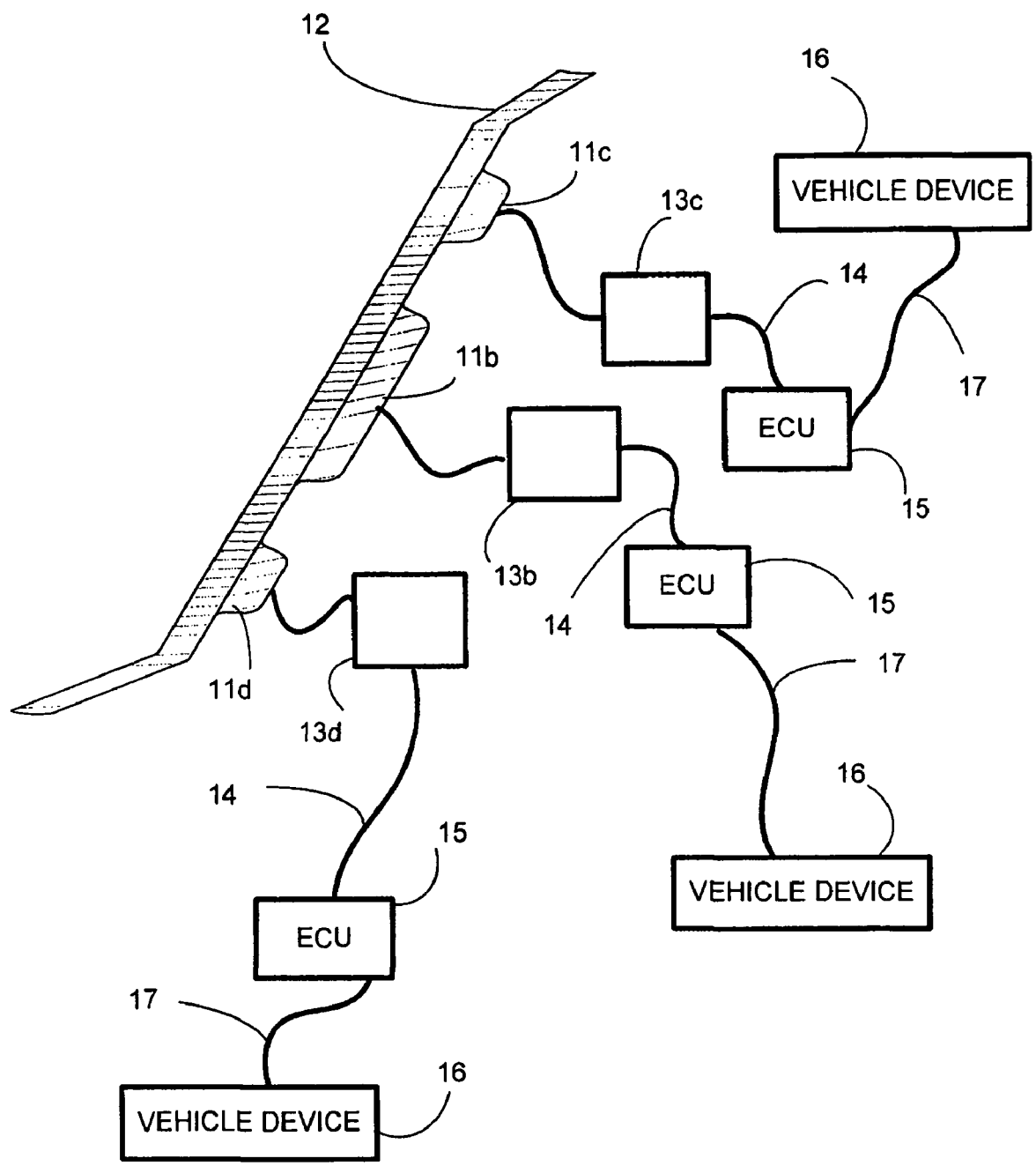
FIG. 3 is a cross-sectional side view of the cluster of electronic switch systems of FIG. 1 shown mounted behind a molded cover of an instrument panel.

Now referring to FIG. 3, electronic switch apparatuses 11c-11d are electronically shown connected with an associated switch interface or controller 13c-13d. Alternately, electronic switch apparatuses 11a-11d may be all coupled to the common switch controller 13. The switch controller 13 distributes switching control signals 14 generated by the corresponding electronic apparatus 11 to an associated vehicle device 16 via an electronic control unit 15. The switch controller 13 is communicatively coupled to the electronic control unit 15 which monitors the status of the switch apparatus 11. Alternately, the electronic control unit 15 may be integral to the switch controller 13.

In response to the switching control signal 14 from the switch interface 13, the electronic control unit 15 provides switch control function signals 17 to a variety of associated vehicle devices, again indicated schematically at 16. Through software, this electronic control unit 15 can be programmed so that the targeted or predetermined switch control function is communicated to the appropriate vehicle device. Further, typical parameters of switches such as dwell times, on/off functions, and others, can also be programmed.

Figure 4:
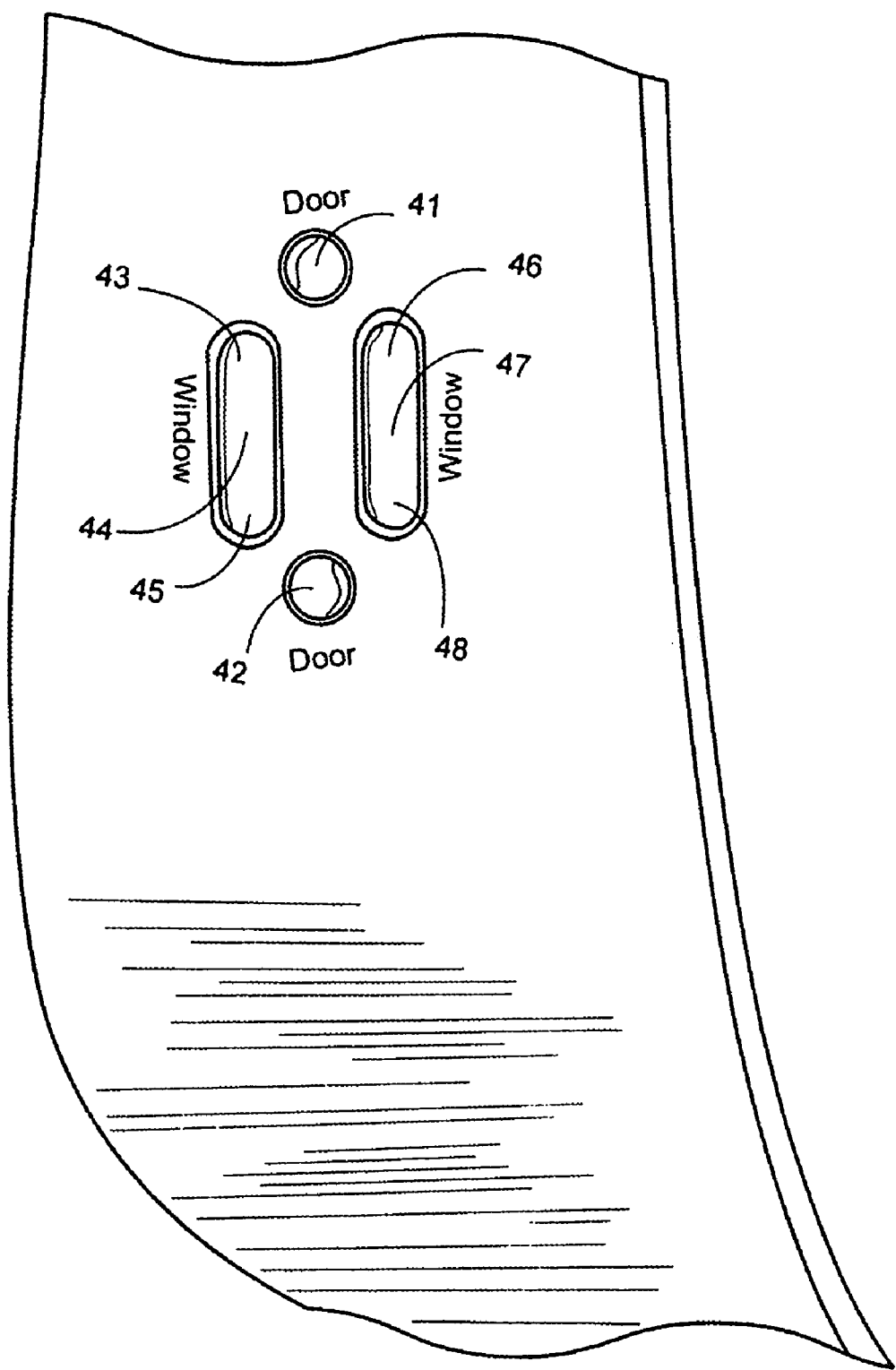
FIG. 4 is a front view of the cluster of electronic switch systems for automotive devices of FIG. 1 displaying with switch function icons.

Now referring to FIG. 4 and without loss of generality, electronic switches 11a and 11b are operable to generate and communicate associated control signals 14 that correspond to raising and lowering controlling functions of a driver side window and of a passenger side window, respectively. Electronic switches 11c and 11d are operable to generate and communicate associated control signals 14 that correspond to locking or unlocking controlling functions of a vehicle door (not shown). In FIG. 4, electronic switches 11a and 11d are shown with a plurality of sensing positions 43, 44, and 45 and 46, 47, and 48, respectively. While, electronic switches 11c and 11d are shown with one sensing position 41 and 42, respectively.

Figure 5:
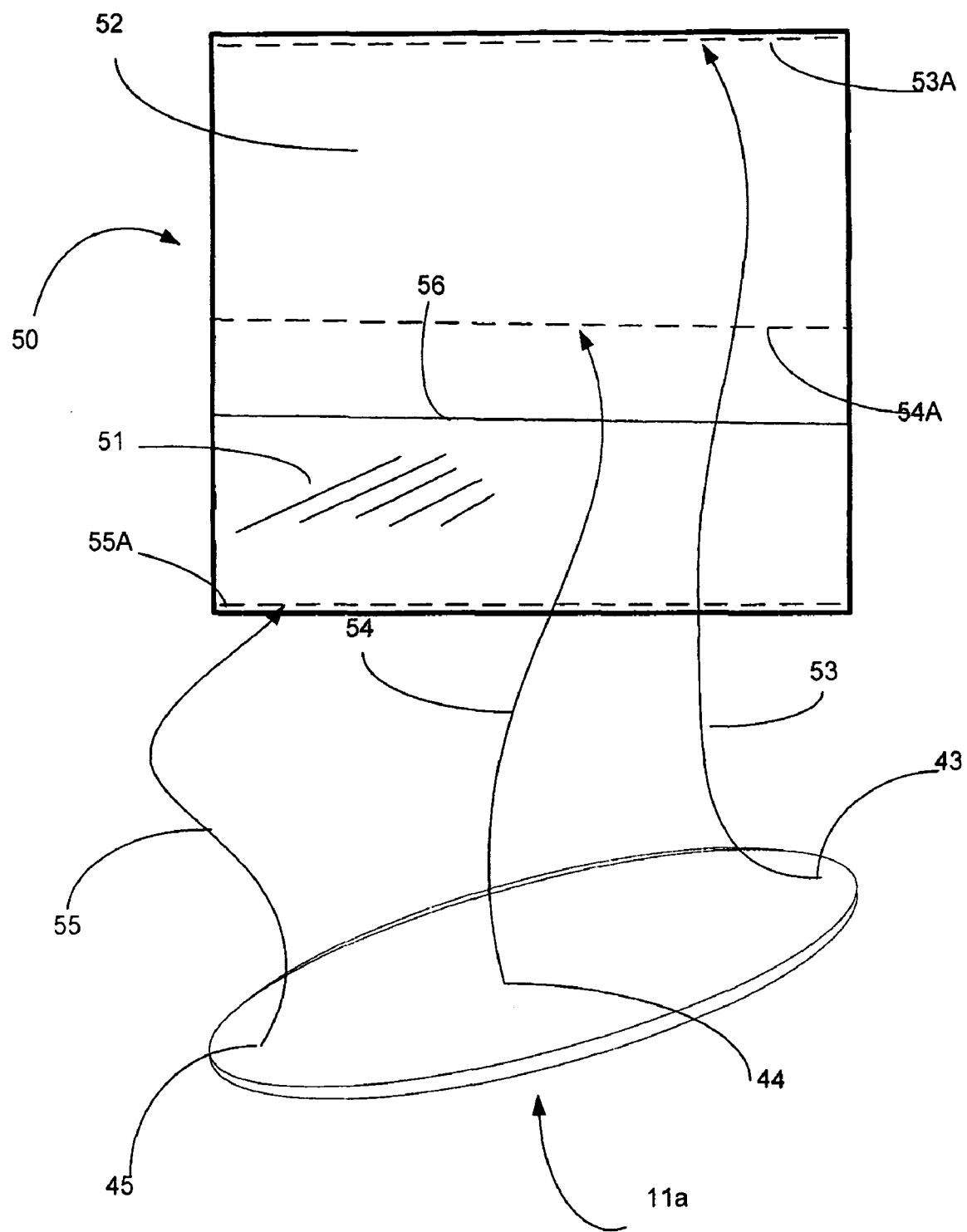
FIG. 5 is a schematic diagram of an electronic switch and a corresponding vehicle window.

Now referring to FIG. 5, electronic switch 11a and a corresponding vehicle window 50 are shown. The vehicle window 50 includes a window panel 51 positionable over an aperture 52 which has a plurality of conditions ranging from fully open to fully closed. Arrows 53, 54, and 55 each indicate a sensing position and corresponding aperture position. Upon actuation of sensing position 43 by a user, the aperture 52 is fully closed and window panel 51 is moved by a movement mechanism (not shown in FIG. 5) such that an upper edge 56 of panel 51 is aligned with uppermost panel position 53A, indicated by dotted line. Similarly, upon actuation of sensing position 44, panel 51 is moved to a position such that upper edge 56 is aligned with dotted line 54A. Actuation of sensing position 45 moves upper edge 56 of panel 51 to a lowermost position 55A. Panel 51 may be raised and lowered by a variety of known movement mechanisms, which will not be discussed herein.

While only three sensing positions 43, 44, and 45 of input pad 17 have been described, it should be understood and appreciated that electronic switch 11a has more than three sensing positions and actuates the panel movement mechanism accordingly. For electronic switches 11a and 11b, sensing positions along input pad 17 correspond to aperture conditions ranging between fully opened and fully closed. Alternately, input pad 17 may be programmed to have a continuum of positions, utilizing the imbedded projective sensing technology to create a unique control signal 14 for each sensing position along the continuum. The corresponding electronic switch 11a is appropriately placed within the automotive vehicle so as to permit the operator (driver or passenger) to conveniently access or approach the sensing positions of input pad 17.

Moreover, electronic switches 11a and 11b may also be programmed to provide controlling functions to both front and rear windows of the vehicle. As such, electronic switches 11a and 11b may also include various safety features, such as a "lock out" feature, such that the vehicle's windows are operable only from the driver's master switch, which prevents young passengers in rear seats from operating the rear windows.

Figure 6:
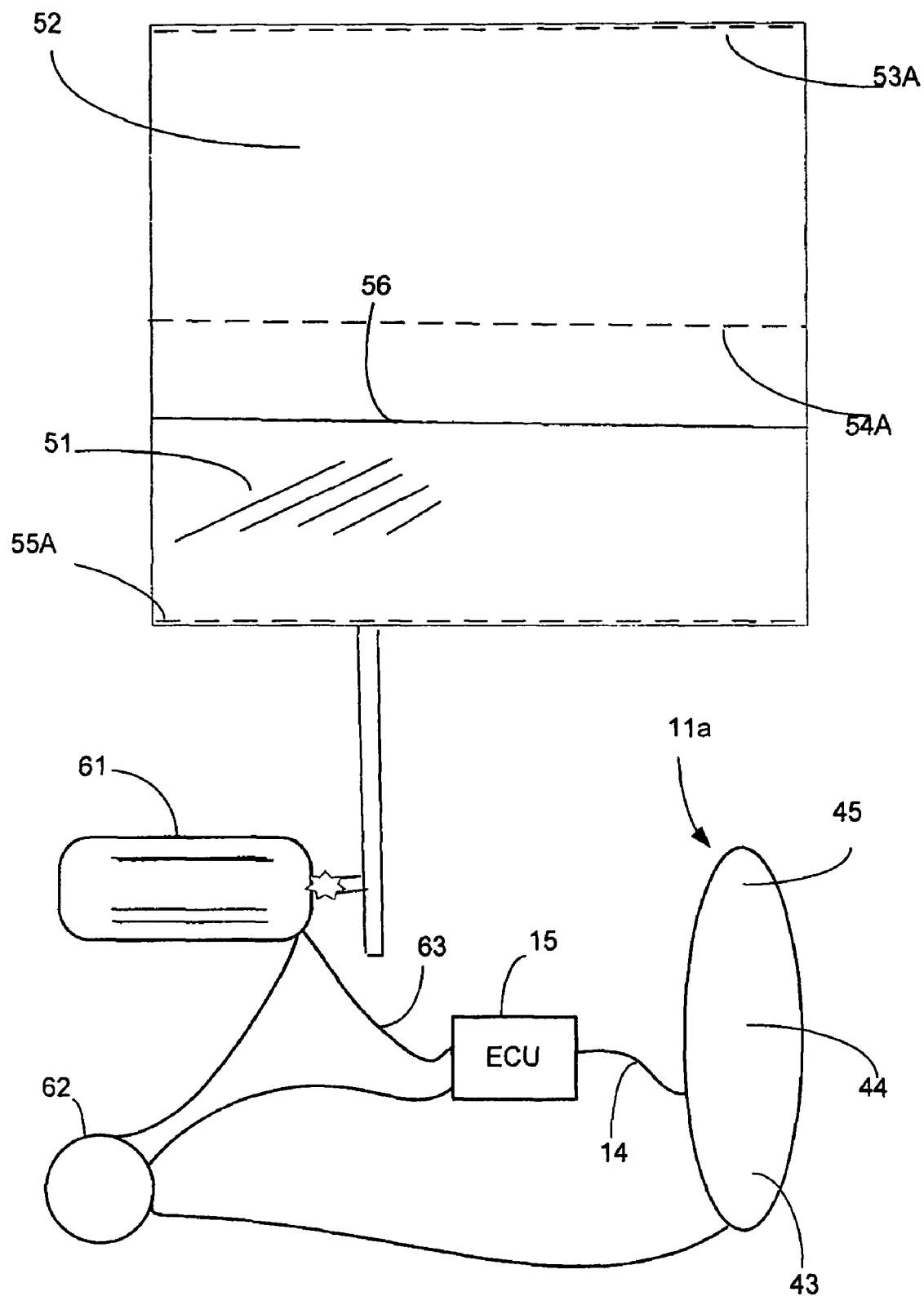
FIG. 6 is a schematic diagram of the electronic switch and the corresponding vehicle window of FIG. 5 along a power source and a motor.

Referring to FIG. 6, the electronic control unit 15 is electrically connected to a motor 61 and a power source 62. Electronic switch 11a having input pad 17 is electrically connected to a widow lift motor 61 via the electronic control unit 15. As such, the electronic control unit 15 is positioned between motor 61 and electronic switch 11a so that the resultant control signal 14 is sent to motor 61. Electronic control unit 15 may operate as an analog-to-digital converter to convert resultant control signal 14 prior to being received by motor 61. Alternately, a separate analog-to-digital converter is used. Electronic control unit 15 may include a microprocessor within which is stored a set of outgoing signals 63 which correspond to the possible range of resultant control signals 14 which input pad 17 may generate. Electronic control unit 15 receives the resultant control signal 14, determines which outgoing signal 63 corresponds to the resultant signal 14, and sends the outgoing signal 63 to window motor 61, which is actuated by the outgoing signal from the switch. Motor 61 then raises or lowers panel 51 within aperture 52 to the position which corresponds to the sensing position of the user.

Position sensors (not shown), which may be embedded in motor 61, may feed back to electronic control unit 15 the current position of panel 51, and control unit 15 may compare the current and desired positions of panel 51 and send an appropriate signal to motor 61 to cause motor 61 to move panel 51 to the desired position.

Alternately, a user's finger, for example, approaches a touch position along the continuum of input pad 17 to adjust panel 51 within aperture 52 so as to achieve a particular aperture condition. When the user wishes to lower panel 51 such that aperture 51 is in its fully opened condition, the user actuates sensing position 45, as seen in FIG. 5. When the user wishes to raise panel 51 such that aperture 51 is in its fully closed condition, the user actuates sensing position 43. If the user wishes to position panel 51 such that aperture 52 is half-closed, the user's finger approaches the sensing position 44, relatively half-way between sensing positions 43 and 45.

Alternately, a discrete number of sensing positions may be utilized, wherein each sensing position corresponds to a discrete input pad 17. For such discrete input pads 17, an odd number of input pads 17 may be used, with at least three input pads 17 being used. This odd number of input pads 17 permits the operator or user to select a "half-way" setting of aperture 54A.

An additional electronic switch (not shown) may be used to permit the operator or passenger to control the condition of all window apertures within the vehicle, such as front and rear windows and a sunroof. This additional electronic switch may used to alternate or toggle the control signals 14 of electronic switch 11a to between front and rear windows, for example. Alternately, this additional electronic switch may permit to singly control all apertures within a vehicle, enabling the operator to move all window panels in the vehicle to the same position at the same time. As such, this additional electronic switch may send a control signal 14 to the electronic control unit 15 so that the window position selected via the actuated sensing position is to be applied to all window panels simultaneously. The electronic control unit 15 may then proceed to actuate all window lift motors 61 within the vehicle, causing movement of all window panels to the appropriate positions.

Moreover, electronic control unit 15 may include a feature which prevents the window from closing on an object which is in the path of travel of the panel 51. Such feature may be programmed in electronic control unit 15, and be implemented in a variety of known ways.

Turning now to electronic control switches 11c and 11d, as shown in FIG. 3, these switches are operable to generate and communicate control signals 14 that correspond to locking and unlocking controlling functions of a driver side door (not shown) and of a passenger side door (not shown), respectively. Electronic switch 11c may correspond to the driver side door, for example, and corresponding input pad 17 may include one discrete sensing position. Upon actuation of this discrete sensing position, the driver side door is locked if previously unlocked, and vice-versa. While only one sensing position of the input pad 17 is described, it should be understood and appreciated that electronic switch 11c has more than one sensing position and actuates a door locking mechanism (not shown) accordingly. Again, the electronic switch 11c is appropriately placed within the automotive vehicle so as to permit the operator (driver or passenger) to conveniently access or approach the sensing positions of input pad 17.

Moreover, electronic switches 11c and 11d may also be programmed so as to provide controlling functions to both pairs of front and rear vehicle doors. As such, electronic switches 11c and 11d may also include various safety features, such as a "lock out" feature, such that the vehicle's doors are operable only from the predetermined driver's switch, which prevents young passengers in rear seats from operating the rear doors. Alternately, another "lock out" feature may be programmed in electronic control unit 15, such that the vehicle's doors are not operable while the vehicle is in motion. The electronic control unit 15 is electrically connected to a locking mechanism (not shown) and a power source (not shown). Electronic switch 11c having input pad 17 is electrically connected to the locking mechanism via the electronic control unit 15. As such, the electronic control unit 15 is positioned between the locking mechanism and electronic switch 11c so that the resultant control signal 14 is sent to the locking mechanism. Electronic control unit 15 receives the resultant control signal 14, determines which outgoing signal corresponds to the resultant signal 14, and sends or communicates the outgoing signal to the locking mechanism, which is actuated by the outgoing signal. Locking mechanism then locks or unlocks the driver side door depending on the previous state of the driver side door or the corresponding sensing position of the user, if the input pad 17 has more than one sensing position.

Lock sensors (not shown), which may be embedded in the locking mechanism, may feed back to electronic control unit 15 the current sate of the driver side door, and control unit 15 may compare the current and desired states of the driver side door and send an appropriate signal to the locking mechanism to cause the locking mechanism to act accordingly. Moreover, the electronic control unit 15 may include a feature which prevents the locking mechanism from actuating when the corresponding door or doors are not closed, i.e. open or ajar. Such features may be programmed in electronic control unit 15, and be implemented in a variety of know ways.

Alternately, a discrete number of sensing positions may be utilized, wherein each sensing position corresponds to a discrete input pad 17. For such discrete input pads 17, an odd number of input pads 17 may be used, with at least three input pads 17 being used. This permits a user to select an override locking state for all vehicle doors by actuating the third designated or predetermined sensing position. As such, this third sensing position may send a control signal 14 to the electronic control unit 15 so that the door state selected via the actuated third sensing position is to be applied to all doors simultaneously. The electronic control unit 15 may then proceed to actuate all locking mechanisms within the vehicle to the selected state (locked or unlocked) of all doors.

Alternately, the electronic switch cluster 10 may be operably configured to control devices with more extensive operator controls. For example, electronic switch cluster 10 may be incorporated to replace a relatively large number of mechanical switches, such as those of full audio system. For such multifunctional devices, the electronic switch cluster 10 may be combined with tact switches or rotatable buttons that may have a plurality of settings, so as to provide appropriate control function signals for each of the plurality of settings.

Alternately, electronic switch cluster 10 may be combined with remote devices, such as in-dashboard navigational devices positioned outside of the operator's reach zone. For example, electronic switch cluster 10 may be incorporated in a steering wheel to remotely control these in-dashboard navigational devices.

Control functions for each of the electronic switches 11a-11d may not be intuitive to the operator, as such markings or graphic overlays may be provided as indicators for corresponding control functions. These markings or graphic overlays may be naming words, abbreviations, contraptions, symbols, and the like. These graphic overlays or markings may be placed directly on the input pads, without interfering with their sensing properties, or along appropriate edges of the electronic switches 11a-11d. Moreover, when these electronic switches 11a-11d are placed behind covering materials, versus being exposed and visible, the corresponding markings may be engraved, indented, or printed on the visible covering materials, such as molded or wrapped skins of instrument panels, door trims, center consoles, overhead consoles, seats, pillars, etc. . . .

Electronic switches 11a-11d can be illuminated so as to be visible and readable in the dark, during night driving for example. The illumination or lighting of the electronic switches 11a-11d may be provided via a light source (not shown), such as a light bulb, provided through in a back side, a radial side or edge opening (not shown) of a housing (not housing) of each of the electronic switches 11a-11d. Light emitted by the light source travels in the respective electronic switches 11a-11d, and may be reflected throughout an interior of the respective electronic switches 11a-11d. Moreover, the lighting of these electronic switches 11a-11d may further provide various visual feedbacks to the user when specific control functions or tasks are requested, have been executed or can not be executed.

Alternately, electronic switches 11a-11d may be configured with haptic feedbacks in response to specific control functions or tasks that are requested, or have been executed or can not be executed. These haptic feedbacks may be in forms of lighting, vibration, or mechanical clicks.

While these electronic switches may be "factory installed" in the automotive vehicle, they may also be retrofitted to existing electronics, windows, doors, sunroof apparatuses, etc.

Accordingly, incorporation of these electronic switches, that integrate the projective capacitive sensing technology, improves the ergonomic environment for the operator and passengers in the automotive vehicle. In addition, the operator or user is enabled to actuate devices to positions other than extreme positions via a relatively simple transitory sensing detection by the electronic switches. The electronic switches do not include moving parts, which minimizes potential switch failures, and their projective sensing technology permits their operations on complex surfaces or their placements or incorporations behind covers or surfaces.

While preferred embodiments of the invention have been described, it should be understood that the invention is not so limited, and modifications may be made without departing from the invention. The scope of the invention is defined by the appended claims, and all devices that come within the meaning of the claims, either literally or by equivalence, are intended to be embraced therein.

We claim:

1. An electronic switch for a device in an automotive vehicle, the electronic switch comprising:
    an input pad mounted in an interior of the automotive vehicle, the input pad comprising a software programmable sensing mechanism operable to generate a plurality of control signals associated with a plurality of sensing positions of the input pad; and
    a controller in communication with the input pad and the device, the controller configured to actuate a plurality of switch control functions of the device in response to the plurality of control signals.

2. The electronic switch of claim 1, wherein the sensing mechanism comprises a projected capacitive sensing unit, which allows functionality before the sensing input pad is touched.

3. The electronic switch of claim 1, wherein the input pad is operable either on or behind various materials, these materials being molded or wrapped skins of instrument panels, dashboards, door trims, center consoles, overhead consoles, seats, pillars, and the like.

4. The electronic switch of claim 1, wherein the input pad comprises a continuum of sensing positions.

5. The electronic switch of claim 1, wherein the electronic switch is mountable for optimal access by an operator.

6. The electronic switch of claim 1, wherein the electronic switch generates each of the plurality of control signals by transitory sensing detections of an object by the input pad.

7. The electronic switch of claim 1, wherein the controller is programmable such that each of the plurality of sensing positions of the input pad corresponds to a unique resultant control signal.

8. The electronic switch of claim 1, further comprising a light source so as to be visible and readable whenever surrounding light is insufficient.

9. The electronic switch of claim 8, wherein the light source is controllable by the controller to provide visual feedbacks.

10. The electronic switch of claim 9, wherein the visual feedbacks correspond to control functions that are requested, are being executed, have been executed or are un-executable.

11. The electronic switch of claim 1, further comprising a haptic feedback mechanism controllable by the controller to provide sensory feedbacks in response to predetermined switch control functions.

12. The electronic switch of claim 11, wherein the haptic feedbacks are vibrations and/or mechanical clicks.

13. The electronic switch of claim 1, further comprising markings and/or graphic overlays provided as indicators for corresponding control functions.

14. The electronic switch of claim 13, wherein the markings and/or graphic overlays placed directly on the input pads do not interfere with the projective sensing properties of the input pads.

15. The electronic switch of claim 13, wherein the markings and/or graphic overlays are engraved, indented, or printed on covering materials behind which the electronic switch is located.

16. The electronic switch of claim 13, wherein the covering materials are molded or wrapped skins of instrument panels, door trims, center consoles, overhead consoles, seats, or pillars.

17. The electronic switch of claim 1, wherein vehicle applications of the electronic switch include human machine interface (HMI) controls.

18. The electronic switch of claim 1, wherein the electronic switch is retrofitted to existing vehicle devices to replace a factory installed switch or switches.

* * * * *